United States Patent [19]
Ho

[11] Patent Number: 5,921,516
[45] Date of Patent: Jul. 13, 1999

[54] FOOTING STRUCTURE OF A HUB

[75] Inventor: Chia-Wei Ho, Hsinchu, Taiwan

[73] Assignee: Accton Technology Corporation, Hsinchu, Taiwan

[21] Appl. No.: 08/992,460

[22] Filed: Dec. 17, 1997

[30] Foreign Application Priority Data

May 30, 1997 [TW] Taiwan ................................. 86208903

[51] Int. Cl.⁶ ....................................................... A47G 1/17
[52] U.S. Cl. ......................................... 248/206.5; 248/688
[58] Field of Search ............................ 248/206.5, 309.4, 248/467, 683, 688, 678, 346.01

[56] References Cited

U.S. PATENT DOCUMENTS

| | | | |
|---|---|---|---|
| 2,627,423 | 2/1953 | Copeman | 248/206.5 |
| 3,361,404 | 1/1968 | Lohr | 248/206.5 |
| 3,514,731 | 5/1970 | Drake | 248/206.5 |
| 4,422,137 | 12/1983 | Watts | 248/206.5 |
| 4,480,361 | 11/1984 | Morita | 248/206.5 |
| 5,368,203 | 11/1994 | Friedrich et al. | 248/206.5 |

*Primary Examiner*—Ramon O. Ramirez
*Assistant Examiner*—Robert Lipcsik
*Attorney, Agent, or Firm*—Rosenberg, Klein & Bilker

[57] ABSTRACT

A footing structure including a plurality of recess holes at a bottom side of a hub, each recess hole having two springy retaining pieces at two opposite sides, and a plurality of metal receptacles respectively mounted in the recess holes and holding a respective magnetic element therein, each metal receptacle having two flanges extended from two opposite side notches thereof and respectively forced into engagement with the springy retaining pieces of the corresponding recess hole.

1 Claim, 5 Drawing Sheets

FOOTING STRUCTURE OF A HUB

BACKGROUND OF THE INVENTION

The present invention relates to hubs for computer network systems, and more specifically to a footing structure for a hub which comprises a plurality of metal receptacles mounted in respective recess holes which disposed at a bottom side of the hub and holding a respective magnetic element for securing to a metal surface of an office furniture or computer peripheral apparatus by magnetic attraction.

A regular hub for use in a computer network system, as shown in FIG. 1, is generally equipped with a plurality of foot pads for positioning on a flat surface. However, the hub may be pulled to move out of place or to fall from a computer peripheral apparatus when the cable is stretched.

SUMMARY OF THE INVENTION

The present invention has been accomplished to provide a footing structure for a hub which eliminates the aforesaid problem. According to the preferred embodiment of the present invention, a plurality of recess holes are made on the bottom side of the hub, two springy retaining pieces are bilaterally made in each recess hole, and a plurality of metal receptacles are respectively mounted in the recess holes and holding a respective magnetic element on the inside and having a respective pair of outward flanges respectively forced into engagement with the springy retaining pieces of the corresponding recess hole. By means of the magnetic elements of the metal receptacles, the hub can be positively secured to a metal surface of an office furniture or computer peripheral apparatus by magnetic attraction.

DETAILED DESCRIPTION OF THE PREFERRED EMBODIMENT

Figure 1:
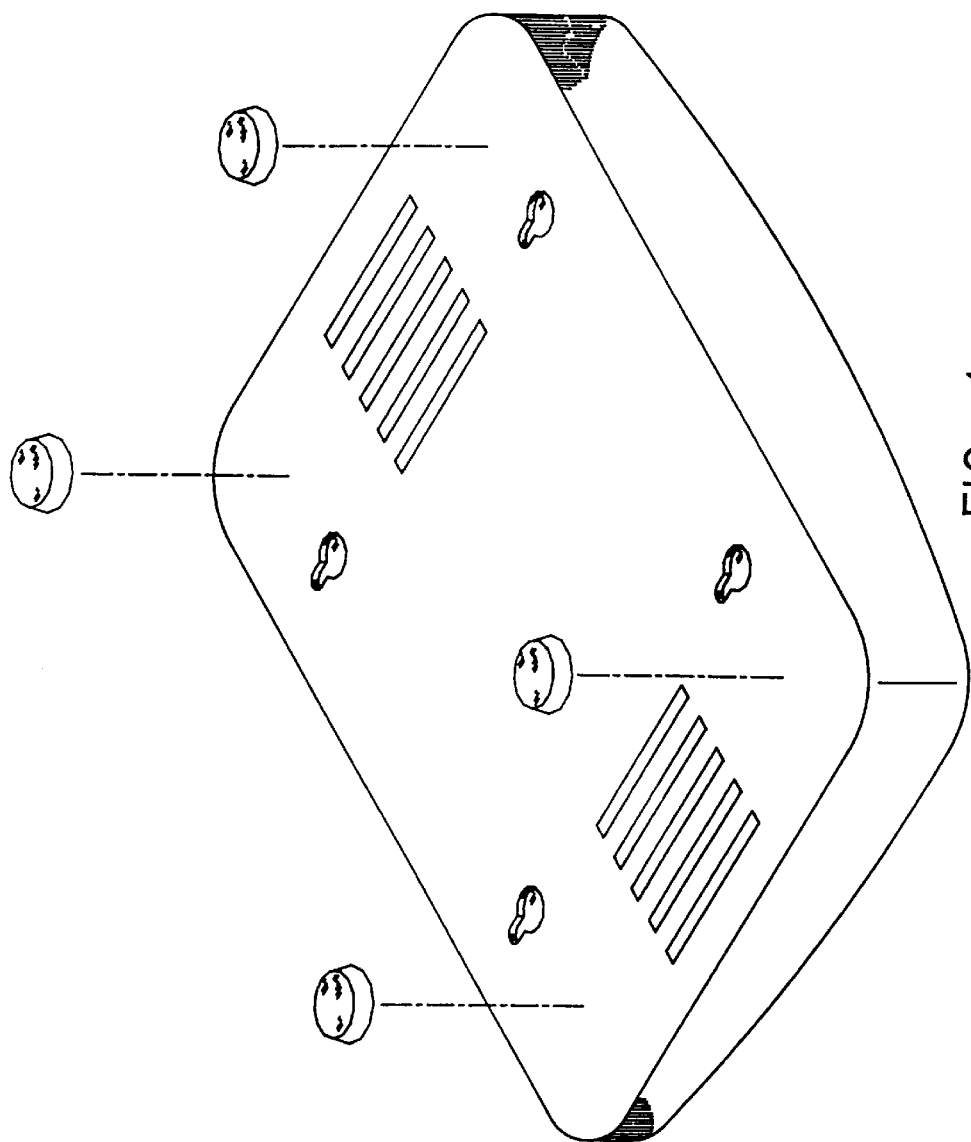
FIG. 1 is an exploded view of a footing structure of a hub according to the prior art.
Figure 2:
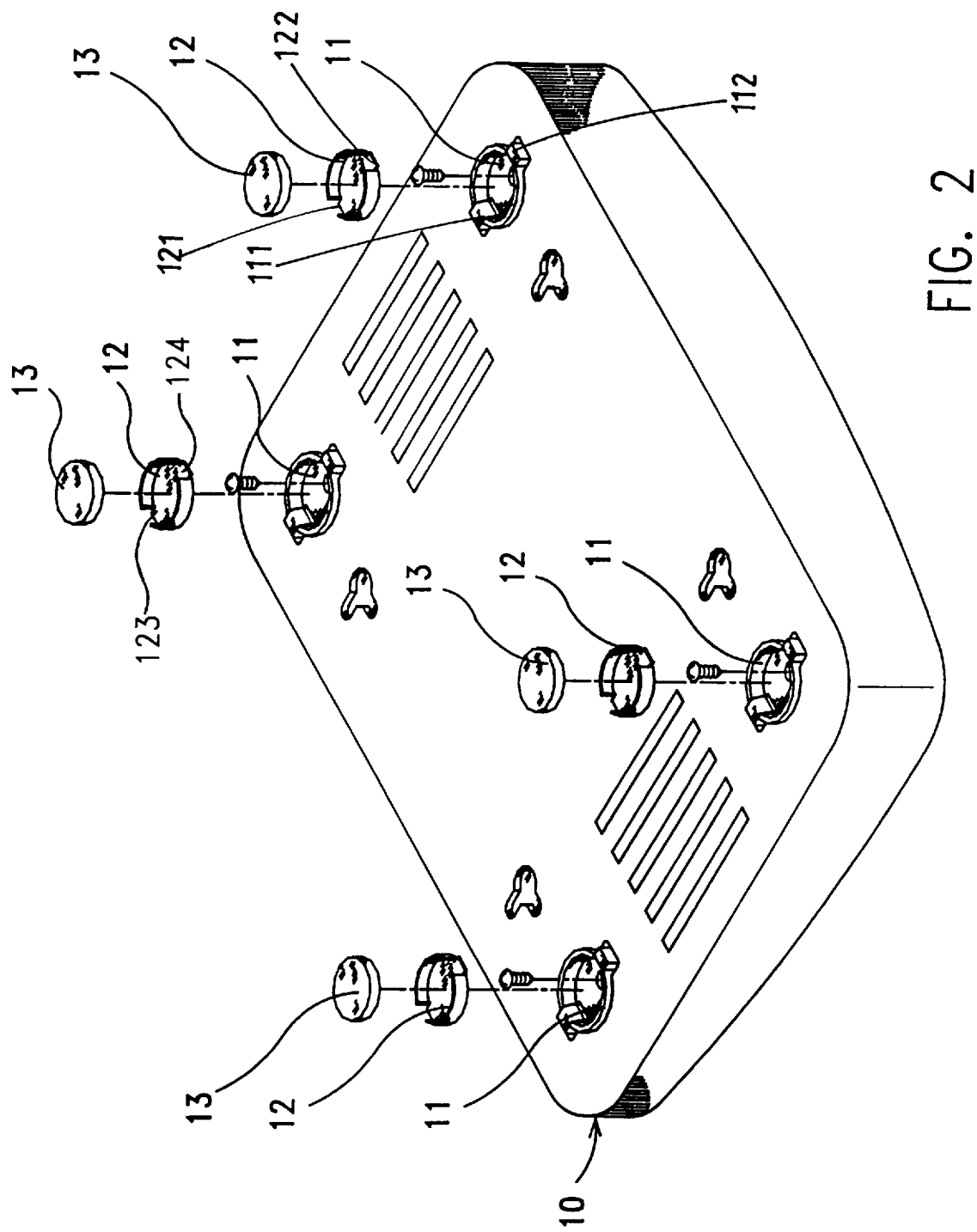
FIG. 2 is an exploded view of a footing structure of a hub according to the present invention.
Figure 3A:
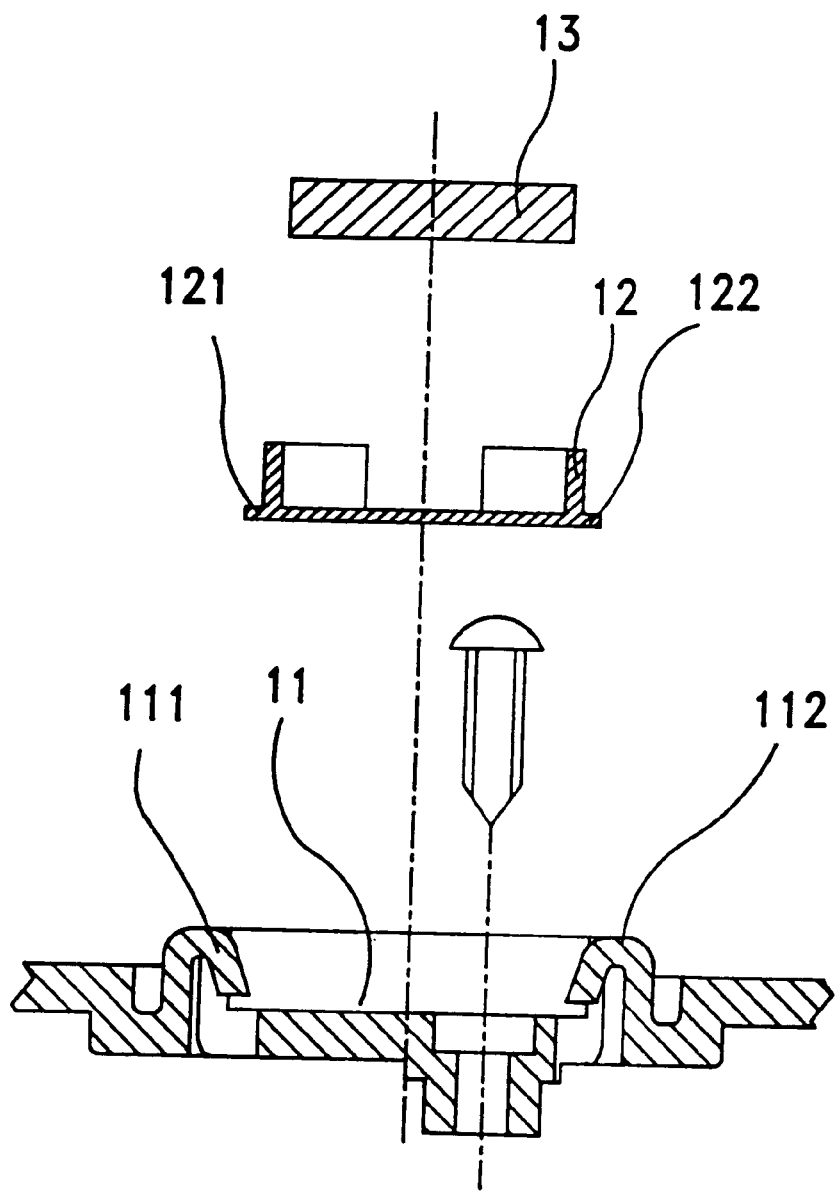
FIG. 3a is a sectional view showing the installation procedure of the present invention.
Figure 3B:
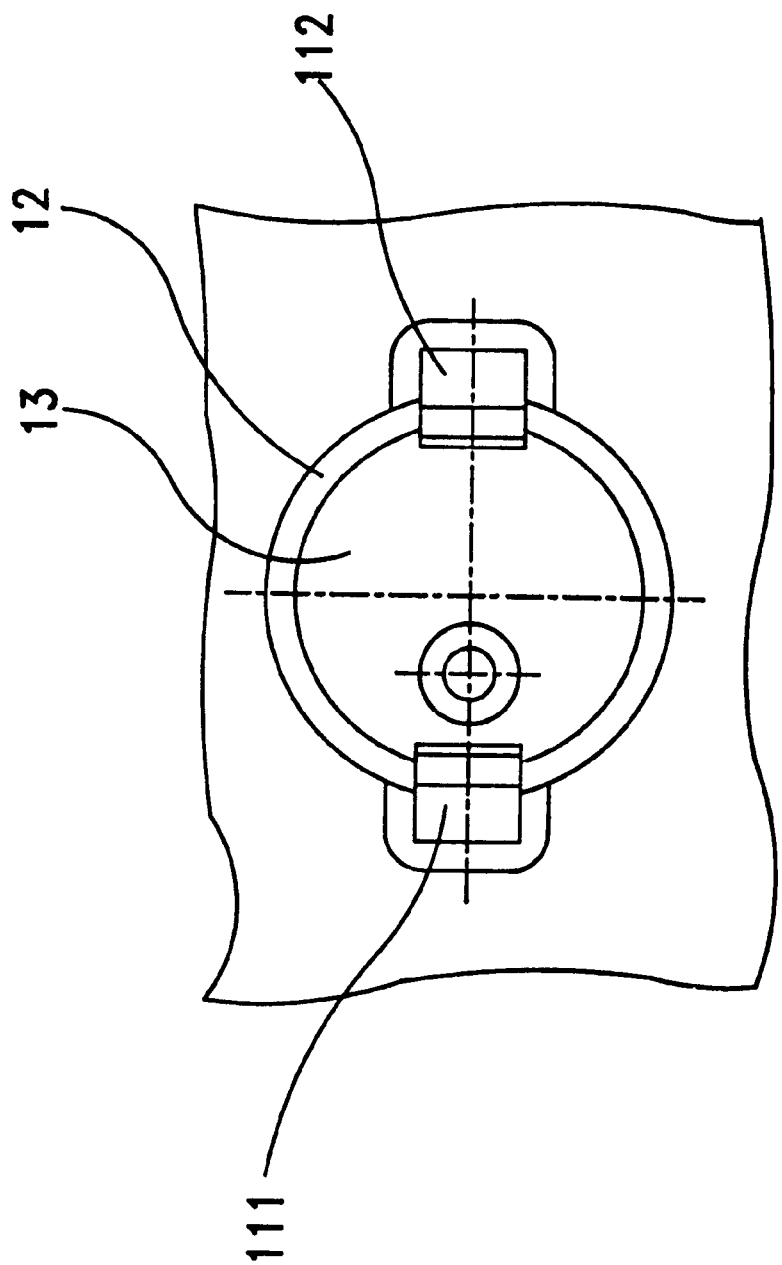
FIG. 3b is a top view of a part of the present invention, showing the footing structure installed.
Figure 4:
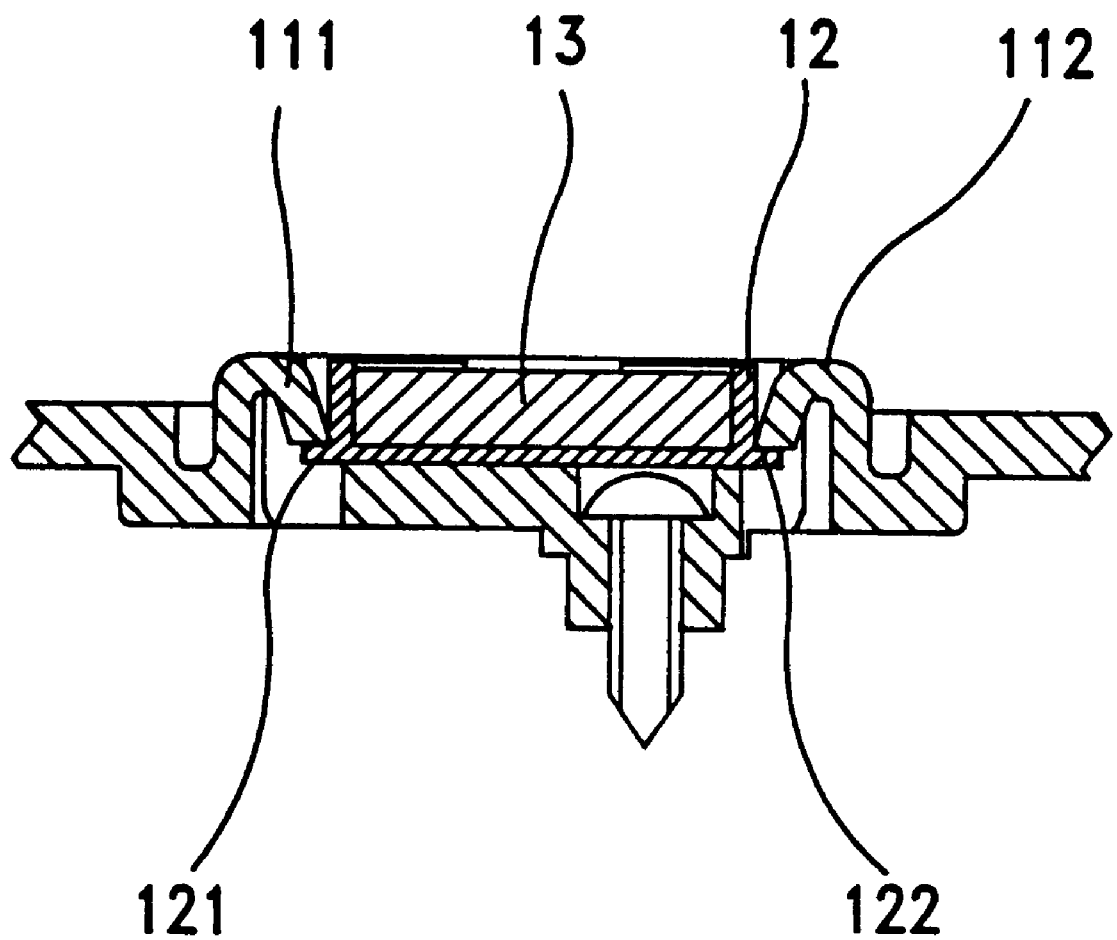
FIG. 4 is a side view in section of a part of the present invention, showing the footing structure installed.

Referring to FIGS. 2, 3a, 3b and 4, the hub, referenced by 10, has a plurality of recess holes 11 at its bottom side, and at least two springy retaining pieces 111;112 symmetrically raised from the periphery of each recess hole 11. A metal receptacle 12 is mounted in each recess hole 11, having for example two flanges 121;122 respectively and outwardly extended from two opposite side notches 123;124 thereof. A magnetic element 13 is mounted within each metal receptacle 12. When one metal receptacle 12 is mounted in one recess hole 11 of the hub 10, the flanges 121;122 are forced into engagement with the corresponding springy retaining pieces 111;112, and therefore the metal receptacle 12 is firmly secured to the hub 10. By means of the magnetic element 13 in each metal receptacle 12, the hub 10 can be firmly secured to a metal casing of a computer peripheral apparatus or a metal surface of an office furniture by magnetic attraction.

While only one embodiment of the present invention has been shown and described, it will be understood that various modifications and changes could be made thereunto without departing from the spirit and scope of the invention disclosed.

What the invention claimed is:

1. A foot structure for releasably securing a hub to a metallic surface comprising a housing of a hub, a plurality of recessed holes formed in a bottom side of said housing, each of said recessed holes having at least one pair of springy retaining pieces disposed at two opposite sides thereof, a plurality of metal receptacles respectively mounted in said recessed holes and each holding a respective magnetic element therein, each of said metal receptacles having at least one pair of flanges respectively and outwardly extending from two opposing side notches formed therein, each said metal receptacle being respectively forced into engagement with said at least one pair of said springy retaining pieces of a corresponding recessed hole.

* * * * *